(12) United States Patent
Curatola et al.

(10) Patent No.: US 10,038,085 B2
(45) Date of Patent: Jul. 31, 2018

(54) HIGH ELECTRON MOBILITY TRANSISTOR WITH CARRIER INJECTION MITIGATION GATE STRUCTURE

(71) Applicant: Infineon Technologies Austria AG, Villach (AT)

(72) Inventors: Gilberto Curatola, Villach (AT); Oliver Haeberlen, Villach (AT); Gerhard Prechtl, Rosegg (AT); Clemens Ostermaier, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/991,517

(22) Filed: Jan. 8, 2016

(65) Prior Publication Data

US 2017/0200817 A1    Jul. 13, 2017

(51) Int. Cl.
| | |
|---|---|
| *H01L 29/778* | (2006.01) |
| *H01L 29/66* | (2006.01) |
| *H01L 21/66* | (2006.01) |
| *H01L 29/20* | (2006.01) |
| *H01L 29/205* | (2006.01) |

(52) U.S. Cl.
CPC .......... *H01L 29/7784* (2013.01); *H01L 22/26* (2013.01); *H01L 29/2003* (2013.01); *H01L 29/205* (2013.01); *H01L 29/66462* (2013.01)

(58) Field of Classification Search
CPC ............. H01L 29/7783; H01L 29/1066; H01L 29/41766; H01L 29/7784; H01L 29/2003; H01L 22/26; H01L 29/66462; H01L 29/205
See application file for complete search history.

(56) References Cited

U.S. PATENT DOCUMENTS

| 8,436,398 B2 | 5/2013 | Lidow et al. | |
|---|---|---|---|
| 8,890,168 B2 | 11/2014 | Lidow et al. | |
| 2012/0193637 A1* | 8/2012 | Kalnitsky | H01L 29/1066 257/76 |

OTHER PUBLICATIONS

Curatola, Gilberto et al., "High Electron Mobility Transistor with RC Network Integrated into Gate Structure", co-pending U.S. Appl. No. 14/674,096, filed Mar. 31, 2015.

* cited by examiner

*Primary Examiner* — Steven Loke
*Assistant Examiner* — Juanita Rhodes
(74) *Attorney, Agent, or Firm* — Murphy, Bilak & Homiller, PLLC (57) ABSTRACT

A method includes providing a heterostructure body with a buffer region, and a barrier region disposed on the buffer region, and forming a gate structure for controlling the channel on the heterostructure body, the gate structure having a doped semiconductor region disposed on the heterostructure body, an interlayer disposed on the doped semiconductor region, and a gate electrode disposed on the interlayer. Forming the gate structure includes controlling a doping concentration of the doped semiconductor region such that a portion of the channel adjacent the gate structure is non-conductive at zero gate bias, and controlling electrical and geometrical characteristics of the interlayer based upon a relationship between the electrical and geometrical characteristics of the interlayer and corresponding effects on a static threshold voltage and a dynamic threshold voltage shift of the semiconductor device.

4 Claims, 13 Drawing Sheets

HIGH ELECTRON MOBILITY TRANSISTOR WITH CARRIER INJECTION MITIGATION GATE STRUCTURE

TECHNICAL FIELD

The instant application generally relates to high electron mobility transistors, and more particularly relates to gate structures for normally-off high electron mobility transistors.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. In a GaN/AlGaN based HEMT, a two-dimensional electron gas (2DEG) arises near the interface between the AlGaN barrier layer and the GaN buffer layer. In an HEMT, the 2DEG forms the channel of the device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

Due to the high electron mobility of the two-dimensional carrier gas in the heterojunction configuration, HEMTs offer high conduction and low losses in comparison to many conventional semiconductor transistor designs. These advantageous conduction characteristics make HEMTs desirable in applications including, but not limited to, use as switches in power supplies and power converters, electric cars, air-conditioners, and in consumer electronics, for example. However, normally-on HEMTs have limited applicability in these applications because these devices must be accompanied by circuitry that can generate the negative voltages necessary to turn the device off. Such circuitry adds cost and complexity to the design. For this reason, it is typically desirable to include features in an HEMT that modify the intrinsic normally-on configuration and provide a device with a normally-off configuration (i.e., a positive threshold voltage).

One technique for providing a normally-off HEMT involves configuring the gate structure to modify the intrinsic conductive state of the 2DEG. For example, a relatively thick (typically 100 nm or greater) p-type doped GaN material can be formed under the gate electrode. This thick p-type GaN layer depletes the inversion layer under the gate structure, shifting the threshold voltage of the device to positive values. The p-type GaN layer must be thick enough to create a vertical field which depletes and populates the naturally occurring inversion channel underlying the barrier layer, typically a layer of AlGaN. The vertical field generated by a voltage applied to the gate electrode allows for on and off modulation of the inversion layer. However, the introduction of dopants into the gate structure of the device may determinately impact one or more device parameters, such as leakage current, maximum gate voltage and transconductance. Accordingly, there is a need to provide a normally-off HEMT without determinately impacting device parameters.

SUMMARY

A method of forming a semiconductor device is disclosed. According to an embodiment, the method includes providing a heterostructure body with buffer region, and a barrier region disposed on the buffer region and having a different band gap than the buffer region such that a two-dimensional charge carrier gas channel arises near an interface between the buffer region and the barrier region. The method further includes forming a gate structure for controlling the channel on the heterostructure body. The gate structure includes a doped semiconductor region disposed on the heterostructure body, an interlayer disposed on the doped semiconductor region, and a gate electrode disposed on the interlayer. Forming the gate structure includes controlling a doping concentration of the doped semiconductor region such that a portion of the channel adjacent the gate structure is non-conductive at zero gate bias. The electrical and geometrical characteristics of the interlayer are controlled based upon a relationship between the electrical and geometrical characteristics of the interlayer and corresponding effects on a static threshold voltage and a dynamic threshold voltage shift of the semiconductor device.

According to another embodiment, the method includes providing a heterostructure body with buffer region, and a barrier region disposed on the buffer region and having a different band gap than the buffer region such that a two-dimensional charge carrier gas channel arises near an interface between the buffer region and the barrier region. The method further includes forming a gate structure for controlling the channel on the heterostructure body. The gate structure includes a doped semiconductor region disposed on the heterostructure body, an interlayer disposed on the doped semiconductor region, and a gate electrode disposed on the interlayer. Forming the gate structure includes determining an optimized thickness value of the interlayer dependent upon at least one of the following parameters: a rate of carrier injection from the gate electrode to the channel, a rate of recombination of injected carriers in the channel, a static threshold voltage of the semiconductor device, and a dynamic threshold voltage shift of the semiconductor device. The interlayer is formed such that it conforms to the optimized thickness value.

A semiconductor device is disclosed. According to an embodiment, the semiconductor device includes a heterostructure body with buffer region, and a barrier region disposed on the buffer region and having a different band gap than the buffer region such that a two-dimensional charge carrier gas channel arises near an interface between the buffer region and the barrier region. The semiconductor device further includes a gate structure on the heterostructure body for controlling the channel. The gate structure includes a doped semiconductor region disposed on the heterostructure body, an interlayer disposed on the doped semiconductor region, and a gate electrode disposed on the interlayer. A doping concentration of the doped semiconductor region is such that a portion of the channel adjacent the gate structure is non-conductive at zero gate bias. A thickness value of the interlayer is dependent upon at least one of the following parameters: rate of carrier injection from the gate electrode to the channel, rate of recombination of injected carriers in the channel, static threshold voltage of the semiconductor device, and dynamic threshold voltage shift of the semiconductor device.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, a normally-off HEMT device is formed with a gate stack that limits the injection of carriers through the intrinsic p-n diode that arises by virtue of the p-type doped gate region in the gate structure. The gate stack includes a non-conductive interlayer formed from, e.g., AlGaN, InGaN or AlN, interposed between the p-type doped gate region and the gate electrode. Generally, the incorporation of a non-conductive layer between the electrode and the p-type doped gate region of a device would be disfavored by designers, as the non-conductive layer lowers the voltage across gate control region and consequently reduces control of the channel. The inventors have found that the non-conductive layer can nonetheless be highly beneficial if it conforms to certain parameters (i.e., thickness, dielectric constant, etc.). The techniques described herein involve controlling the parameters of the interlayer to provide a favorable tradeoff. More particularly, the electrical and physical characteristics of the interlayer are controlled to be dependent upon one or more of: a rate of carrier injection from the gate electrode to the channel, a rate of recombination of injected carriers in the channel, a static threshold voltage of the semiconductor device, and a dynamic threshold voltage shift of the semiconductor device. The inventors have discovered that if the interlayer is configured such that the rate of carrier injection from the gate electrode to the channel is effectively equal to the rate of recombination of injected carriers in the channel under normal device operation, a favorable reduction in dynamic threshold voltage shift can be achieved without substantially impacting static threshold voltage of the device.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer structures. In general, the normally-off compound semiconductor transistor can be realized using any suitable III-nitride technology such as GaN that permits the formation of opposite polarity inversion regions due to piezoelectric effects.

Specifically with regard to GaN technology, the presence of polarization charges and strain effects in a GaN-based heterostructure body due to piezoelectric effects yield a two-dimensional charge carrier gas in the heterostructure body characterized by very high carrier density and carrier mobility. Such a two-dimensional charge carrier gas, such as a 2DEG (two-dimensional electron gas) or 2DHG (two-dimensional hole gas), forms the conductive channel of the HEMT near the interface between, e.g., a GaN alloy barrier region and a GaN buffer region. A thin, e.g. 1-2 nm, AlN layer can be provided between the GaN buffer region and the GaN alloy barrier region to minimize alloy scattering and enhance 2DEG mobility. In a broad sense, the compound semiconductor transistors described herein can be formed from any binary, ternary or quaternary III-nitride compound semiconductor material where piezoelectric effects are responsible for the device concept.

Figure 1:
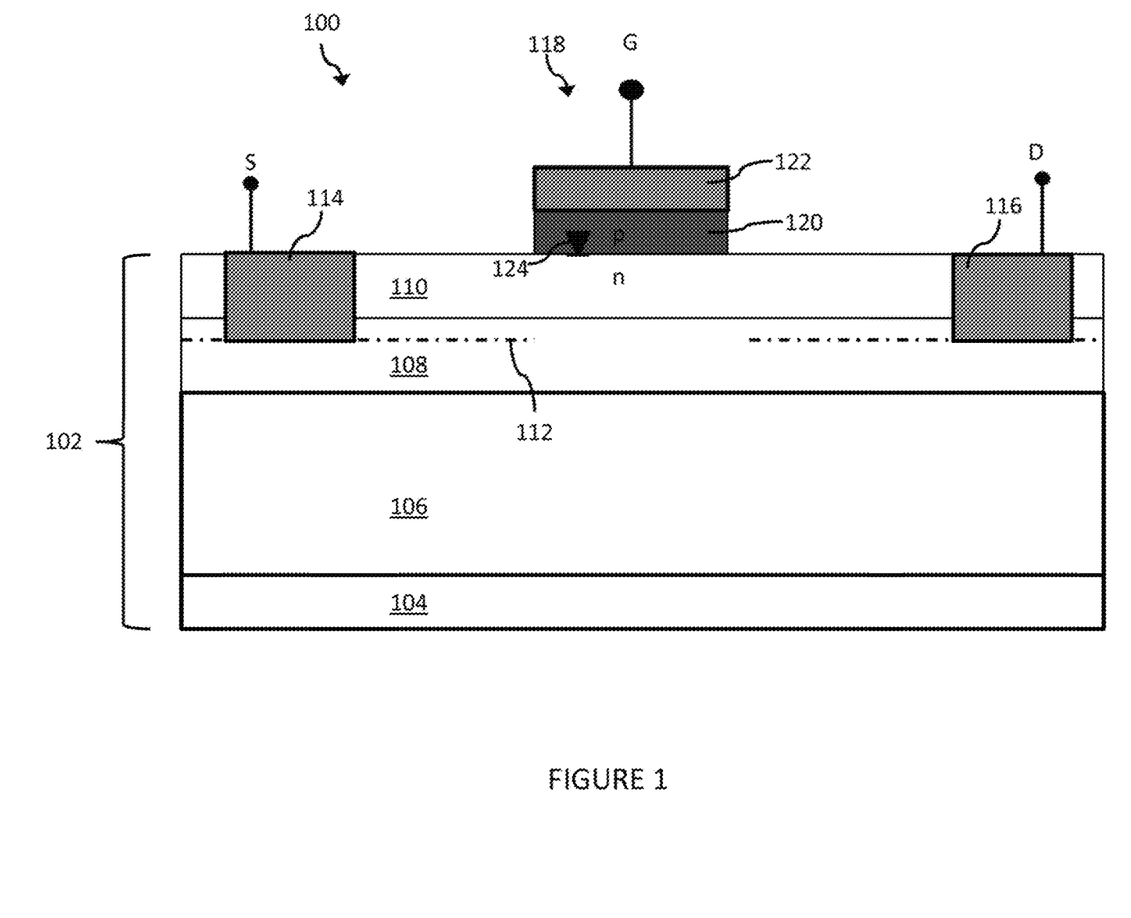
FIG. 1 illustrates a cross-sectional view of an embodiment of a normally-off compound semiconductor transistor.

Referring to FIG. 1, a semiconductor device 100 is depicted, according to an embodiment. The semiconductor device 100 is configured as a normally-off HEMT. The semiconductor device 100 includes a heterostructure body 102. The heterostructure body 102 includes a bulk semiconductor (e.g., Silicon) substrate region 104, a type III-V doped semiconductor nitride (e.g., AlGaN) backbarrier region 106 formed on the substrate region 104, a type III-V undoped semiconductor nitride (e.g., GaN) buffer region 108 formed on the backbarrier region 106, and a type III-V doped semiconductor nitride (e.g., AlGaN) barrier region 110 formed on the buffer region 108. The material of the buffer region 108 has a different band gap than the material of the barrier region 110 such that a two-dimensional charge carrier gas channel 112 intrinsically arises near an interface between the buffer region 108 and the barrier region 110. That is, the buffer region 108 and the barrier region 110 form a heterojunction.

The semiconductor device 100 further includes source and drain contacts 114, 116 in ohmically contacting the channel 112. The source and drain contacts 114, 116 are formed from an electrically conductive material, such as a metal or highly doped semiconductor. According to one embodiment, the source and drain contacts 114, 116 extend completely through the barrier region 110 and physically contact the channel 112. However, physical contact is not necessary and the source and drain contacts 114, 116 may alternatively be spaced apart from the channel 112 but nonetheless be in ohmic connection with the channel 112.

The semiconductor device 100 further includes a gate structure 118 disposed on the heterostructure body 102. The gate structure 118 includes a doped semiconductor region 120 that is formed on the barrier region 110 in close proximity to the channel 112. An electrically conductive gate electrode 122 is provided on the doped semiconductor region 120. Optionally, the gate structure 118 may be provided in a recess formed in the heterostructure body 102 such that the doped semiconductor region 120 is spaced closer to the channel 112 than the main surface of the heterostructure body 102. According to an embodiment, the doped semiconductor region 120 is formed from a p-type semiconductor nitride material (e.g., GaN). The thickness and doping concentration of the doped semiconductor region 120 is controlled such that, without any external bias applied to the gate electrode 122, the two-dimensional charge carrier gas near the heterojunction is locally depleted in a region beneath the gate structure 118. That is, the parameters of the doped semiconductor region 120 are controlled to provide a normally-off HEMT device.

In a commonly known manner, the gate structure 118 is configured to control a conductive state of the channel 112. ON/OFF control is achieved by suitable biasing of the gate electrode 122. The gate structure 118 is configured to turn the device ON with a sufficient voltage applied to the gate electrode 122 that removes the depleted region of the two-dimensional charge carrier gas underneath the gate structure 118. As a result, the channel 112 forms a conductive connection between the source and drain contacts 114, 116.

Because the barrier region 110 is formed from an n-type material (e.g., AlGaN) and the doped semiconductor region 120 is formed from a p-type material (e.g., p-type GaN) a p-n diode 124 forms at the interface between the gate structure 118 and the heterostructure body 102. In general, this diode 124 is unwanted, but a necessary byproduct of incorporating a p-type region into the gate structure 118 to achieve a normally-off configuration. One drawback of the diode 124 is that it can become forward biased at sufficiently high gate voltages. As a result, a leakage path opens up between the input and output terminals of the device 100, and the power consumption of the device 100 increases. Furthermore, when this diode 124 is forward biased, holes are injected into the channel 112 region of the device. These holes become trapped while the device remains ON because p-type contacts are generally not feasible in GaN technology. Before the device 100 can be switched off, these trapped holes must recombine with electrons. This leads to a delay in switch off. In sum, the diode 124 detrimentally impacts dynamic switching behavior and power consumption of the device 100.

Figure 2:
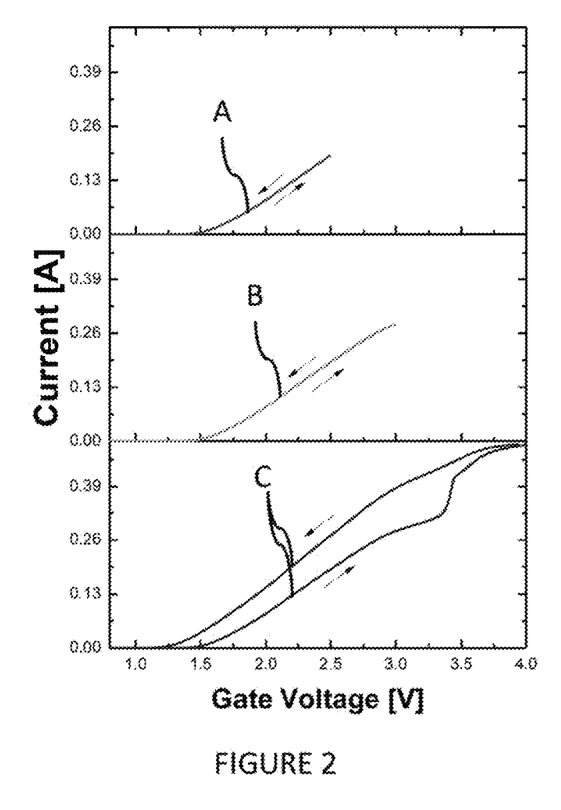
FIG. 2 illustrates dynamic transfer curves for an embodiment of a normally-off compound semiconductor transistor being operated at different gate voltages.

Referring to FIG. 2, the impact of the diode 124 on the switching behavior of the device 100 is depicted. As can be seen from the upper curves A and B, the I-V characteristics of the device during switch-on (represented by the upward tilting arrows) mirror the I-V characteristics of the device during switch-off (represented by the downward tilting arrows). These curves A and B correspond to lower gate-source voltages in which the diode 124 does not become forward biased. As shown in curve C, at higher gate-source voltages, a hysteresis effect occurs. That is, the device does not turn off in the same way that it turned on. At these higher gate-source voltages, the forward conduction of the diode 124 causes carriers to be injected into the channel 112, which must first be removed before the device can be turned off. As a result, dynamic behavior of the device 100, such as $R_{DSON}$, leakage, and breakdown voltage is detrimentally impacted. In fact, at certain operational points, the injection effect may be so pronounced as to render the device 100 completely unreliable and/or inoperable.

Figure 3:
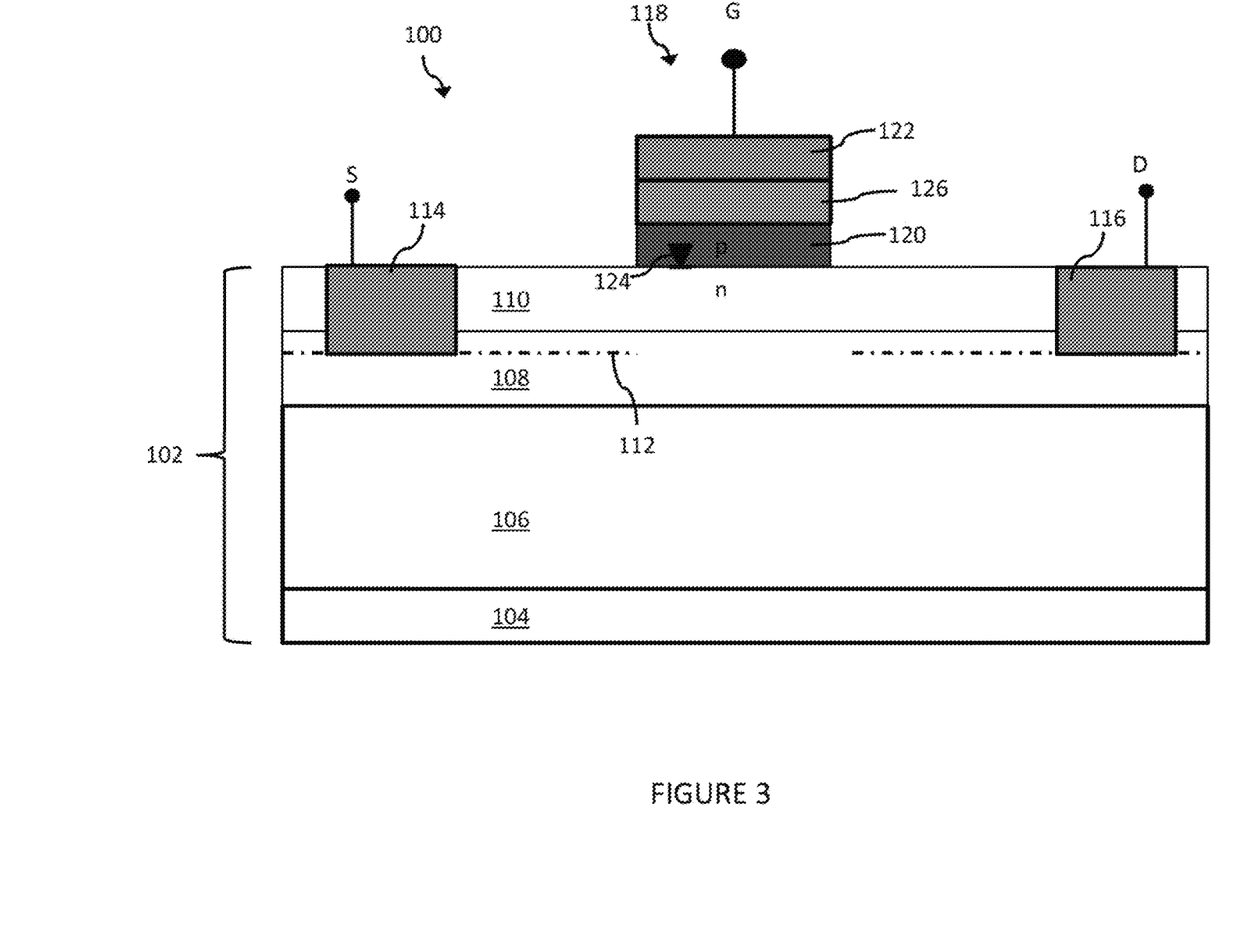
FIG. 3 illustrates a cross-sectional view of an embodiment of a normally-off compound semiconductor transistor with an interlayer incorporated into the gate structure that limits the amount of carriers flowing through the gate diode, according to an embodiment.

Referring to FIG. 3, a semiconductor device 100 is depicted. The semiconductor device 100 of FIG. 3 is substantially identical to the semiconductor device 100 of FIG. 1, except that the gate structure 118 includes an interlayer 126 interposed between the doped semiconductor region 120 and the gate electrode 122. The interlayer 126 is formed from a different material than the doped semiconductor region 120 with different electrical properties than the doped semiconductor region 120. In general, the interlayer 126 is configured to present an energy barrier between the gate electrode 122 and the doped semiconductor region 120 and thereby restrict the flow of holes between the two. According to one embodiment, the interlayer 126 is formed from a lightly doped n-type semiconducting material, such as InGaN and AlGaN. Alternatively, the interlayer 126 may be formed from an electrical insulator, such as AlN, SiN, $Al_2O_3$, $HfO_2$, $ZrO_2$, etc. Additional layers (not shown) may be provided in the gate structure 118. Furthermore, the interlayer 126 may be formed from a combination of the materials described herein, such as a combination of InGaN, AlGaN and AlN, etc. More specific properties of the interlayer 126 will be discussed in further detail below.

The electrical and geometrical characteristics of the interlayer 126 are advantageously controlled to restrict the amount of carriers injected into the channel 112 through the diode 124 and thereby mitigate the above described drawbacks of the diode 124. The thickness and material composition of the interlayer 126 can be chosen according to the following guidelines. The primary effects that are accounted for are: (i) hole injection from the gate metallization; ii) electron-hole recombination effects; and (iii) voltage drop on high band-gap materials. The first two mechanisms (i) and (ii) must be carefully balanced in order to maintain static performance of the device 100 while, at the same time, reducing unwanted dynamic effects as much as possible. The main risk of mitigating mechanisms (i) and (ii) too much, on the other hand, is detrimentally impacting the static properties of the device 100, such as threshold voltage and overall current drive capability. In other words, the risk in using the interlayer 126 to reduce the dynamic effects by limiting carrier injection is that this sacrifices the overall performance of the device 100.

Figure 4:
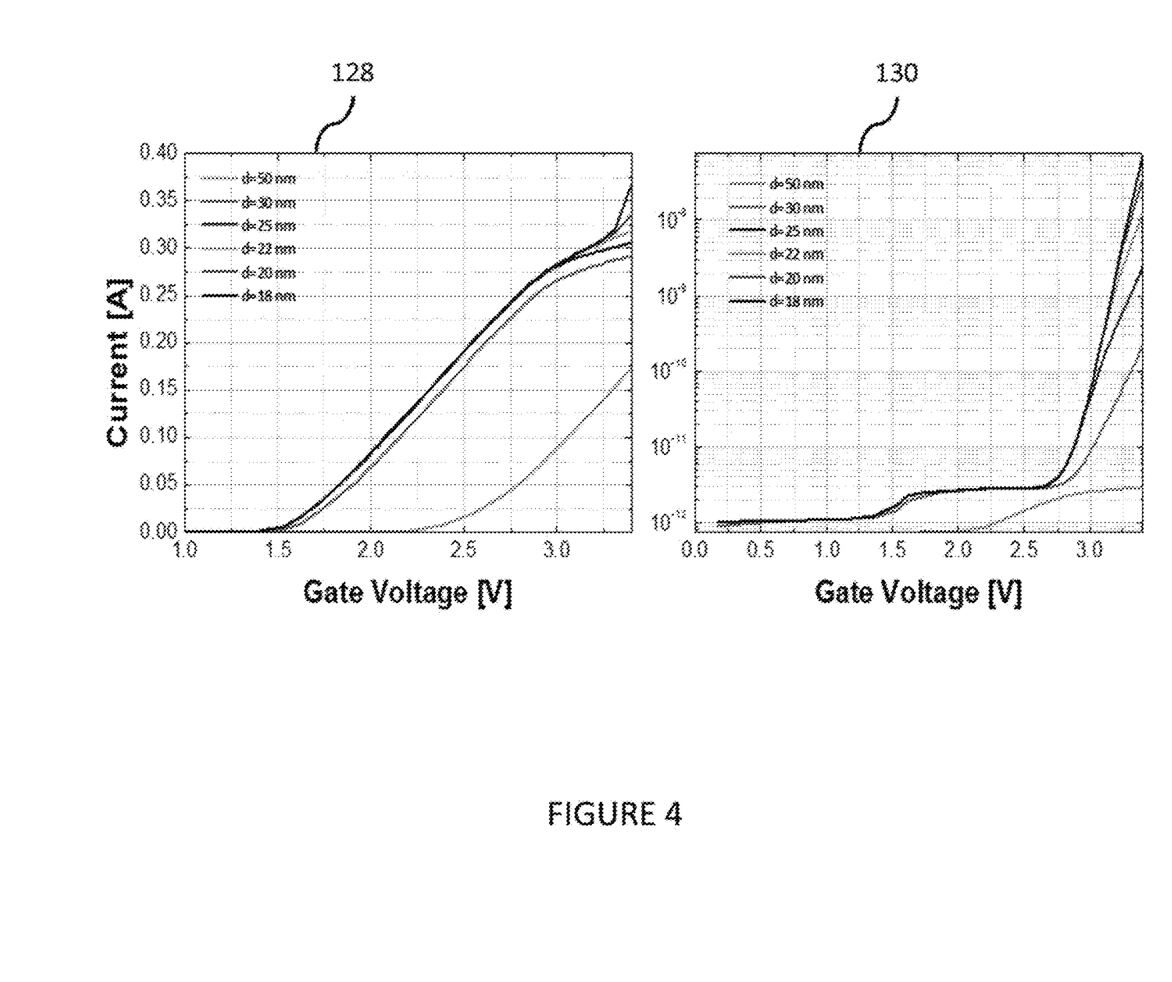
FIG. 4 illustrates a comparison of various thicknesses of the interlayer and corresponding effects on the transfer curve and leakage current of the normally-off compound semiconductor transistor of FIG. 3, according to an embodiment.

Referring to FIG. 4, the relationship between the electrical and geometrical characteristics of the interlayer 126 and static device performance is depicted. In the FIG. 4, the thickness of the interlayer 126 has been varied between 18 nm (nanometers) and 50 nm. The other parameters of the device 100 remain the same.

The leftmost plot 128 shows the transfer characteristics (i.e., input voltage vs. output current) of the device 100 for the varying thicknesses of the interlayer 126. As can be seen, the effect of increasing the thickness of the interlayer 126 from 18-25 nm has very little influence on the transfer characteristics. The threshold voltage and current drive capability remains essentially the same for these values. However, once the interlayer 126 thickness is increased to 30 nm, a noticeable shift in threshold voltage occurs. Further, by increasing the thickness from 30 nm to 50 nm, a dramatic shift in threshold voltage occurs.

The rightmost plot 130 shows gate leakage current of the device 100 for the varying thicknesses of the interlayer 126. As can be seen, interlayer 126 thicknesses from 18-30 nm perform similarly up until gate voltages of about 2.75V (volts). By contrast, an interlayer 126 thickness of 50 nm substantially mitigates leakage current.

Figure 5:
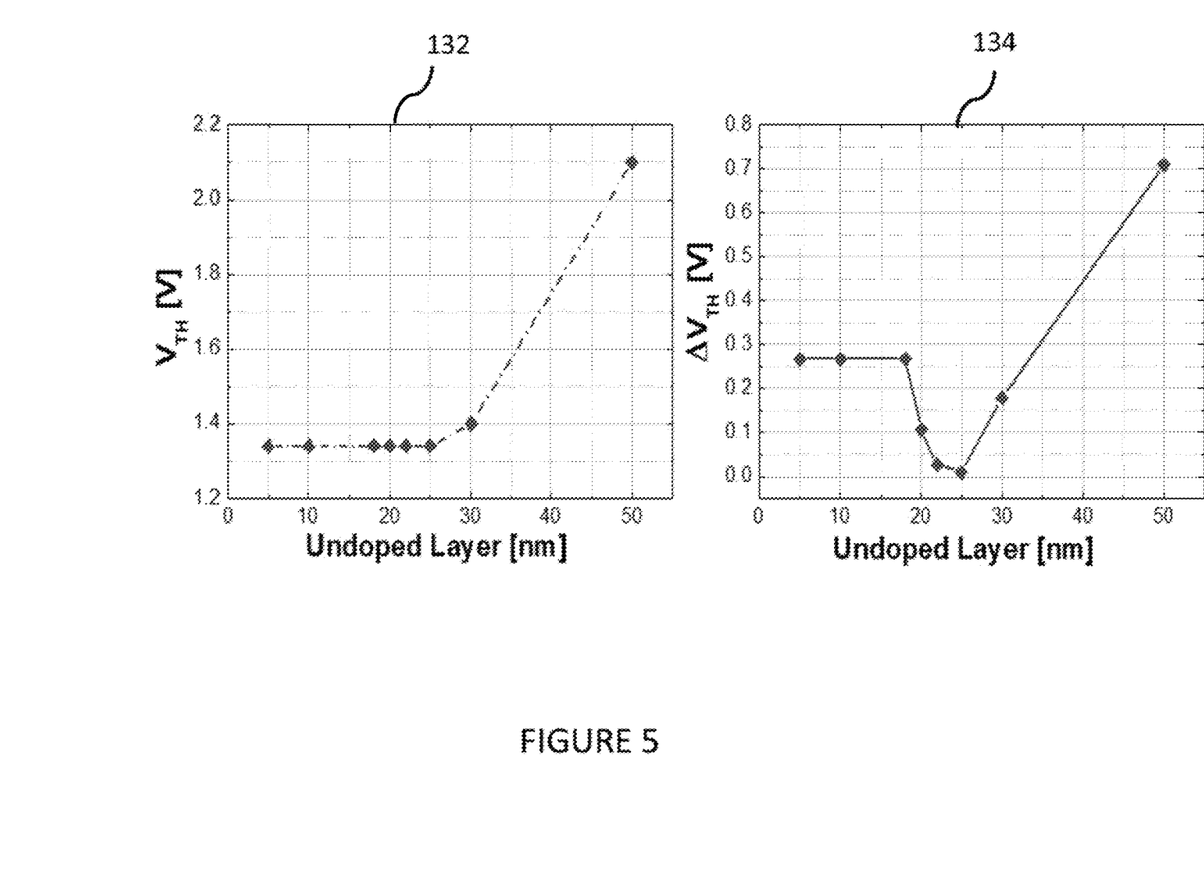
FIG. 5 illustrates a comparison of various thicknesses of the interlayer and corresponding effects on static threshold voltage and dynamic threshold voltage shift of the normally-off compound semiconductor transistor of FIG. 3, according to an embodiment.

Referring to FIG. 5, the impact of thickness of the interlayer 126 and threshold voltage of the device 100 is depicted. The leftmost plot 132 shows static threshold voltage $V_{TH}$ of the device 100 as a function of interlayer 126 thicknesses between 5 and 50 nm. The rightmost plot 134 depicts dynamic threshold voltage shift $\Delta V_{TH}$ (i.e., the change in threshold voltage $V_{TH}$ after switching the device 100) as a function of interlayer 126 thicknesses between 5 and 50 nm. As can be seen from the static characteristics, there is a linear relationship between interlayer 126 thicknesses and static threshold voltage $V_{TH}$ of the device 100 at thicknesses above 25 nm. However, when observing the dynamic characteristics shown in the rightmost plot 134, one can see an "optimum" point where unwanted dynamic effects can be virtually eliminated. At this optimum point, the dynamic threshold voltage shift $\Delta V_{TH}$ is negligible. At this precise optimum point, there is equilibrium between the total amount of holes injected from the gate electrode 122 and present in the gate interlayer 126 material and the total electron-hole pair recombination effects. Thus, electron-hole pair recombination does not become the limiting factor in the switch off of the device 100.

FIGS. 4-5 demonstrate that by appropriately tailoring the electrical and geometrical characteristics of the interlayer 126, the detrimental effects of the diode 124 can be substantially abrogated or eliminated. In the example of FIG. 4-5, the electrical and geometrical characteristics of the interlayer 126 are varied by adjustment to the thickness of the interlayer 126. However, it should be noted that the absolute values of the interlayer 126 thickness, including the optimum point, will vary, depending upon the characteristics of the device 100. For example, actual thickness values of the interlayer 126 can depend on the doping concentration of the doped semiconductor region 120 and the properties (e.g., thickness) of the barrier region 110. Moreover, as those of ordinary skill will appreciate, it is possible to achieve the effects shown in FIGS. 4-5 by varying other parameters besides thickness of the interlayer 126 that achieve a corresponding effect on the flow of carriers. For example, similar effects may be found by varying the dielectric constant of the interlayer 126. This may be done, for example, by utilizing different material types and/or doping concentrations. In general, any of the electrical or physical properties of the interlayer 126 can be modified to reach a point where there is equilibrium between the total amount of holes injected from the gate electrode 122 and present in the gate interlayer 126 material and the total electron-hole pair recombination effects.

Figure 6:
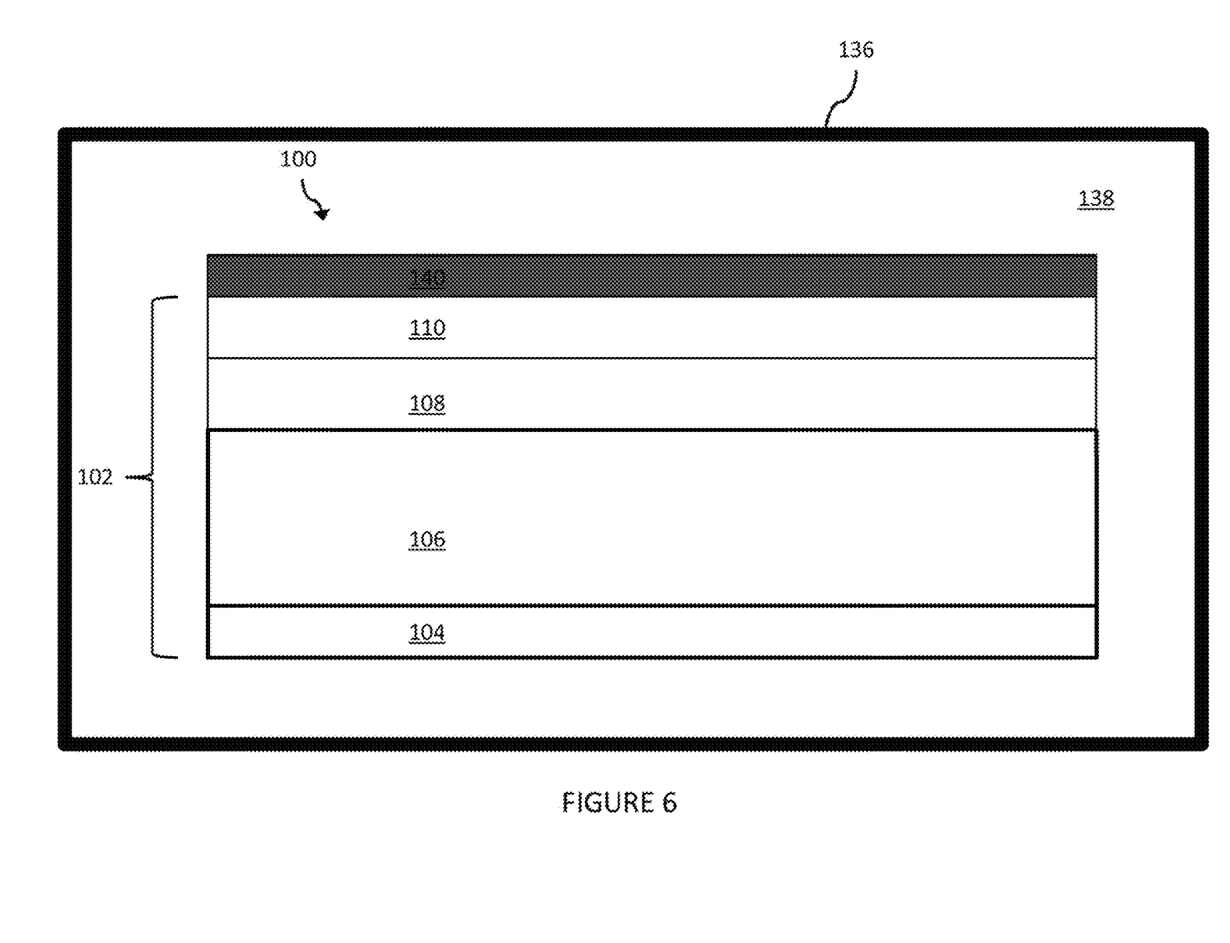
FIGS. 6-10 illustrate select method steps for forming the normally-off compound semiconductor transistor of FIG. 3, according to an embodiment.

Referring to FIG. 6, a method of forming a semiconductor device 100 is depicted, according to an embodiment. According to the method, the heterostructure body 102 as described with reference to FIG. 1 is provided. The heterostructure body 102 can be provided according to any of a variety of well-known techniques. For example, the substrate region 104 can be provided from a bulk semiconductor material. The backbarrier region 106, the buffer region 108, and the barrier region 110 can each be formed using an epitaxial growth technique, for example. An epitaxial deposition process may be carried out by an epitaxial deposition tool 136 having an epitaxial chamber 138 in which the substrate region 104 is placed in. The same epitaxial deposition tool 136 may be used for all of the epitaxial deposition processes described herein. Alternatively, different tools may be used to form the different layers.

After forming the heterostructure body 102, a first doped semiconductor nitride (e.g., p-type GaN) layer 140 is formed on the barrier region 110. The first doped semiconductor nitride layer 140 can be formed by epitaxial deposition, for example. The doping concentration of the first doped semiconductor nitride layer 140 is controlled such that the two-dimensional charge carrier gas that arises between the buffer region 108 and the barrier region 110 is effectively depleted.

Figure 7:
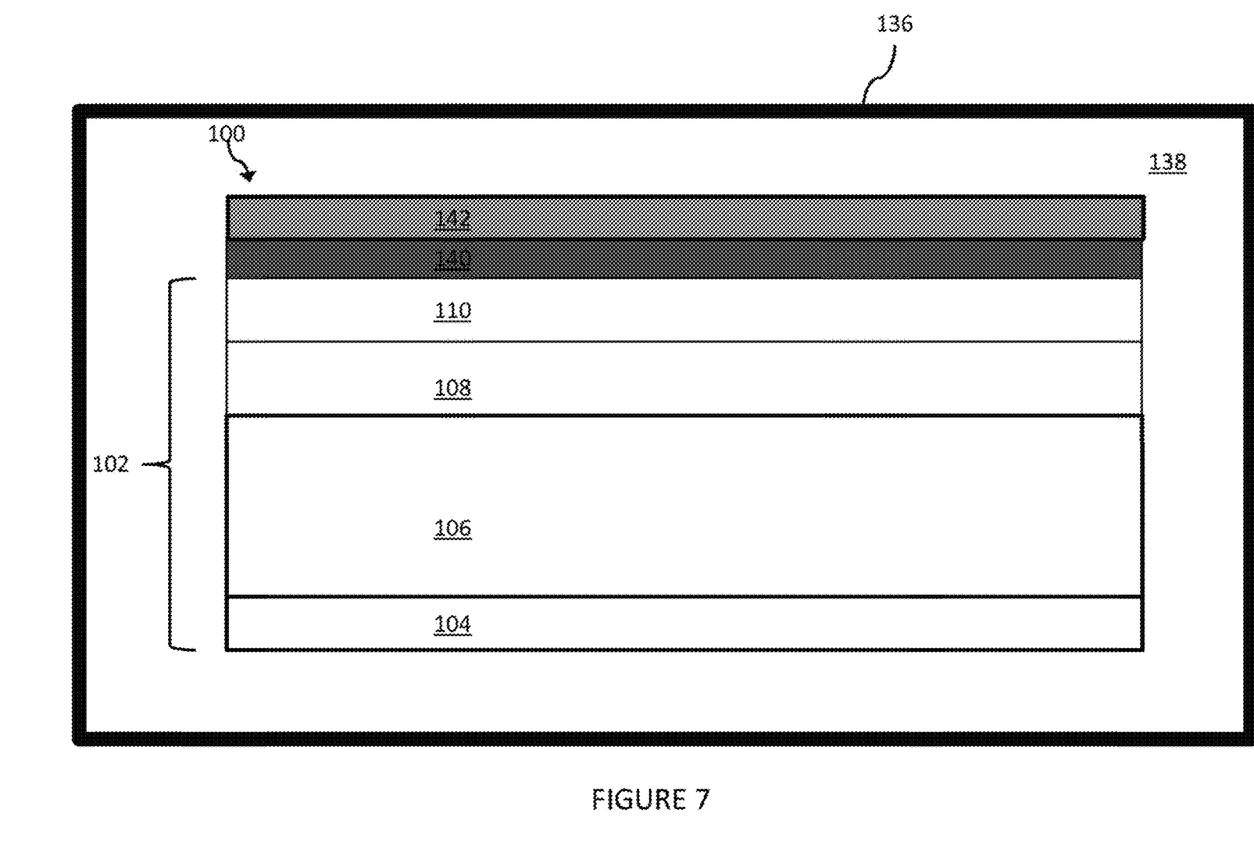

Referring to FIG. 7, a second semiconductor nitride (e.g., AlGaN) layer 142 is formed on the first doped semiconductor nitride layer 140. According to an embodiment, the second semiconductor nitride layer 142 is formed using epitaxial deposition. The second semiconductor nitride layer 142 is used to form the interlayer 126 of the semiconductor device 100 described herein. Accordingly, the step of forming the second semiconductor nitride layer 142 as shown in FIG. 6 is controlled to achieve the proper electrical and geometrical characteristics of the interlayer 126 described herein. These electrical and geometrical characteristics can be controlled by determining beneficial or optimum parameter values (e.g., thickness, dielectric constant, etc.) via simulation and growing the second semiconductor nitride layer 142 to conform to these values. According to another technique, a testing feedback loop is employed. For example, a device 100 can be fabricated according to the techniques described herein. Subsequently, the device 100 is tested to determine parameters such as dynamic threshold voltage shift of the semiconductor device, rate of carrier injection from the gate electrode to the channel, and a rate of recombination of injected carriers in the channel at various gate voltages. This information is compiled and used to determine beneficial or optimum parameter values (e.g., thickness, dielectric constant, etc.) of the second semiconductor nitride layer 142. These values are used to control the growth of the second semiconductor nitride layer 142 to conform to these beneficial or optimum parameter values. A particular thickness of the second semiconductor nitride layer 142 can be achieved by controlling the time duration and/or the number of epitaxial deposition cycles of the process. According to one embodiment, the thickness value is determined extraneously from the epitaxial deposition process, either experimentally or through simulation.

Figure 8:
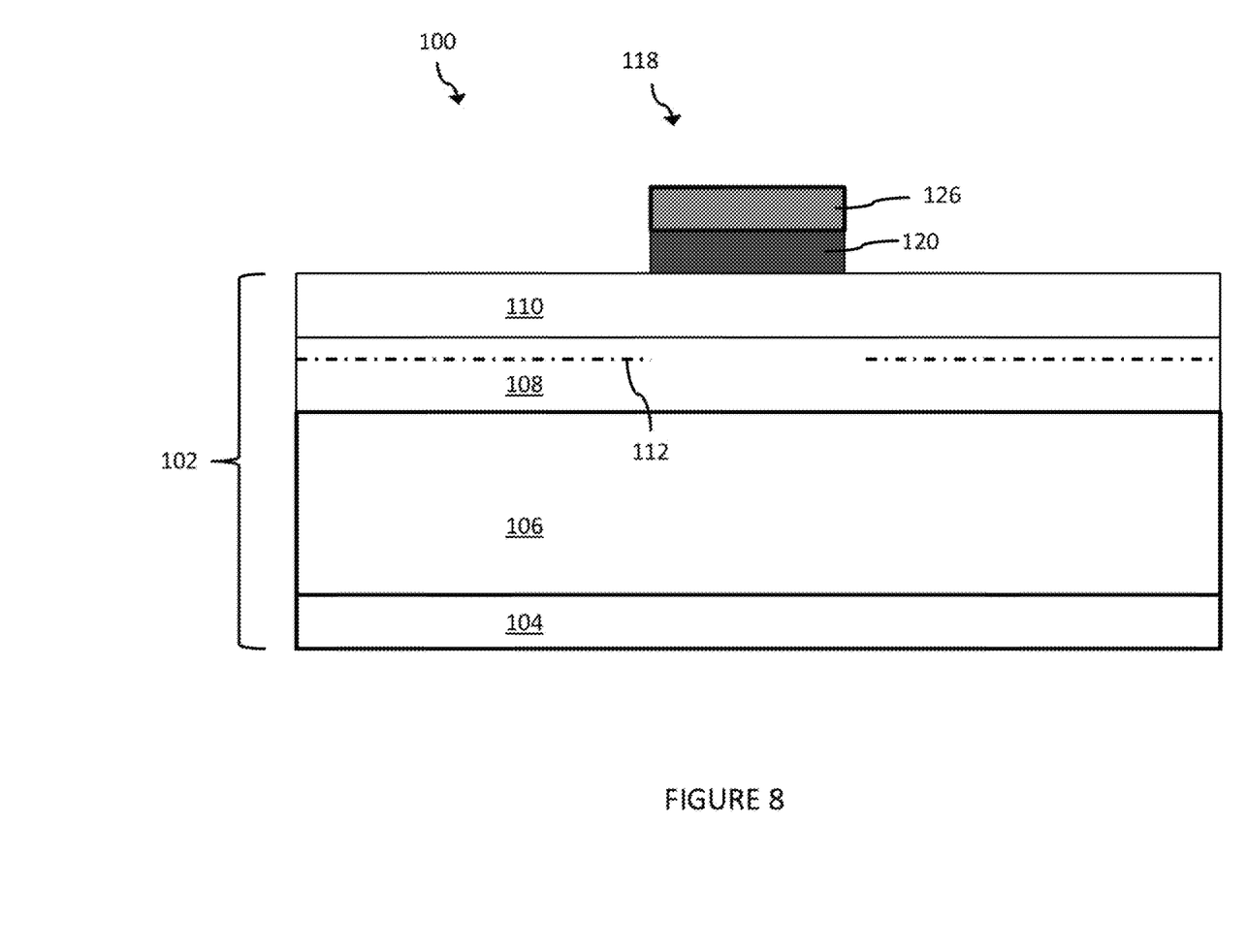

Referring to FIG. 8, portions of the first doped semiconductor nitride layer 140 and the second semiconductor nitride layer 142 are removed. This may be done by an etching technique, for example. As a result, the doped semiconductor region 120 and the interlayer 126 of the gate structure 118 are provided.

Figure 9:
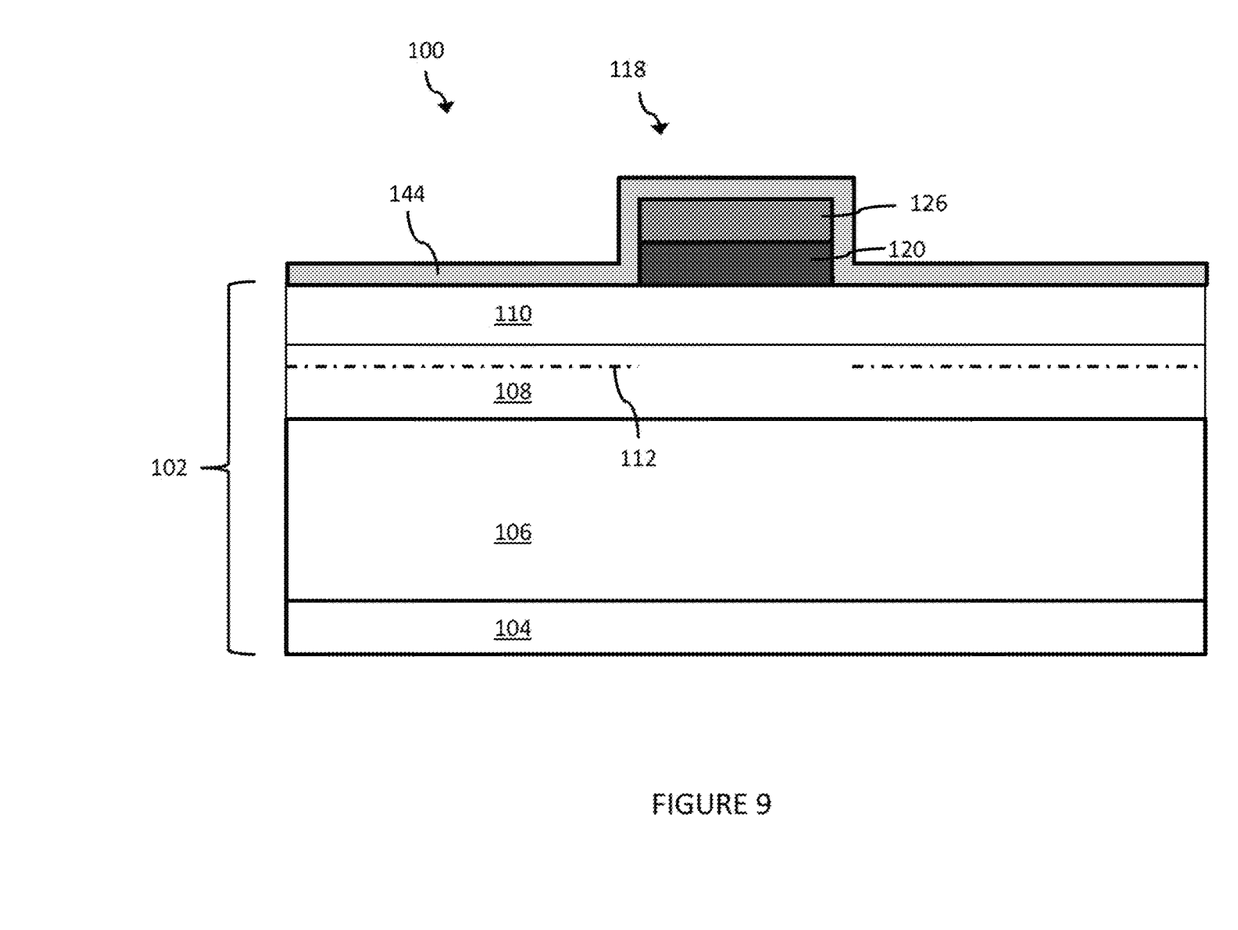

Referring to FIG. 9, a passivation layer 144 is formed on the heterostructure body 102 and the gate structure 118. The passivation layer 144 is an electrically insulating layer, such as SiN that is configured to electrically isolate and protect the heterostructure body 102. The passivation layer 144 may be formed by a deposition technique, for example.

Figure 10:
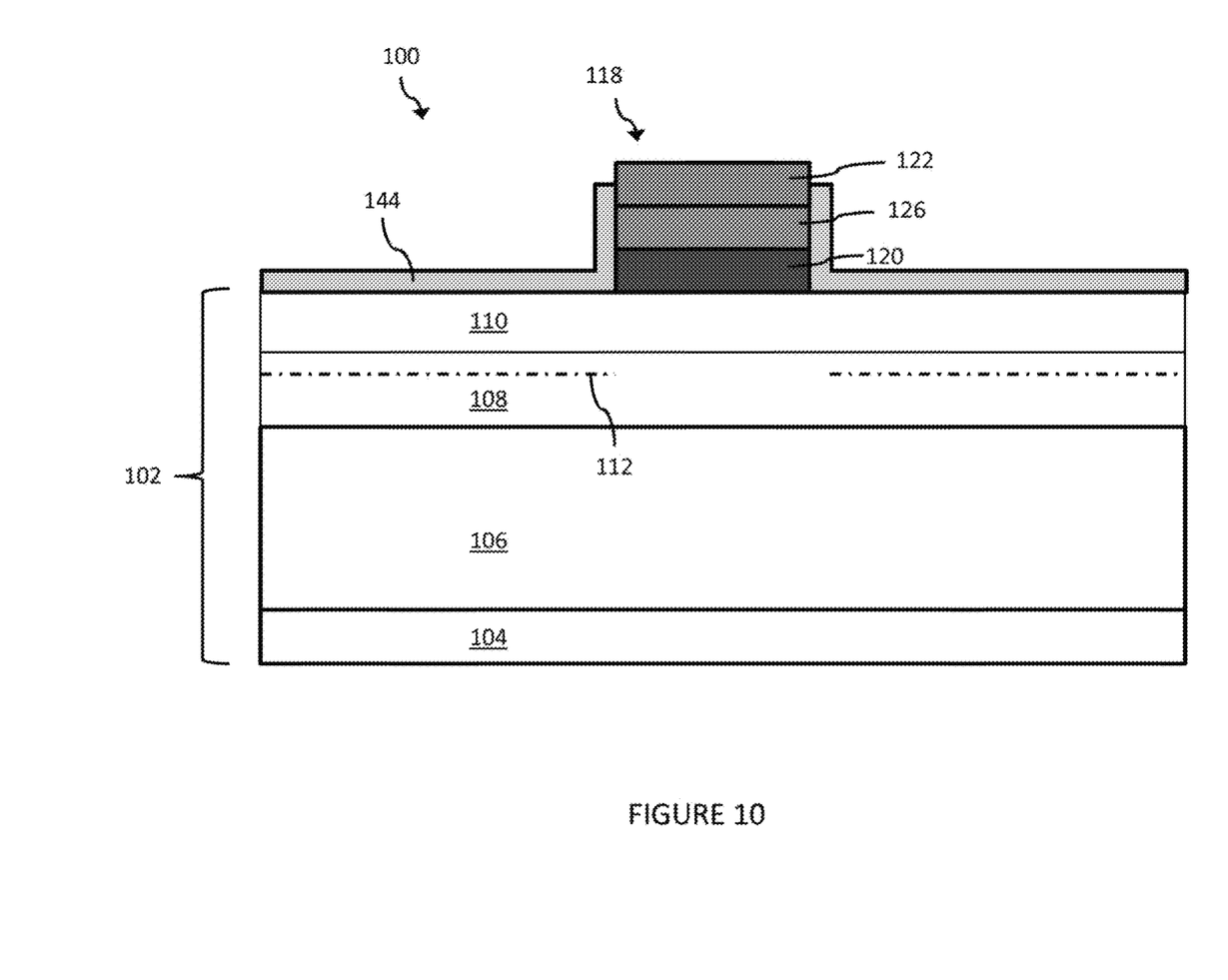

Referring to FIG. 10, the gate electrode 122 is formed on the interlayer 126. The gate electrode 122 may be formed by removing a portion of the passivation layer 144 that is arranged on the interlayer 126 so as to expose a region of the interlayer 126. This may be done by an etching technique, for example. Subsequently, the gate electrode 122 is formed on the interlayer 126 in the exposed region, e.g., by metal deposition.

Figure 11:
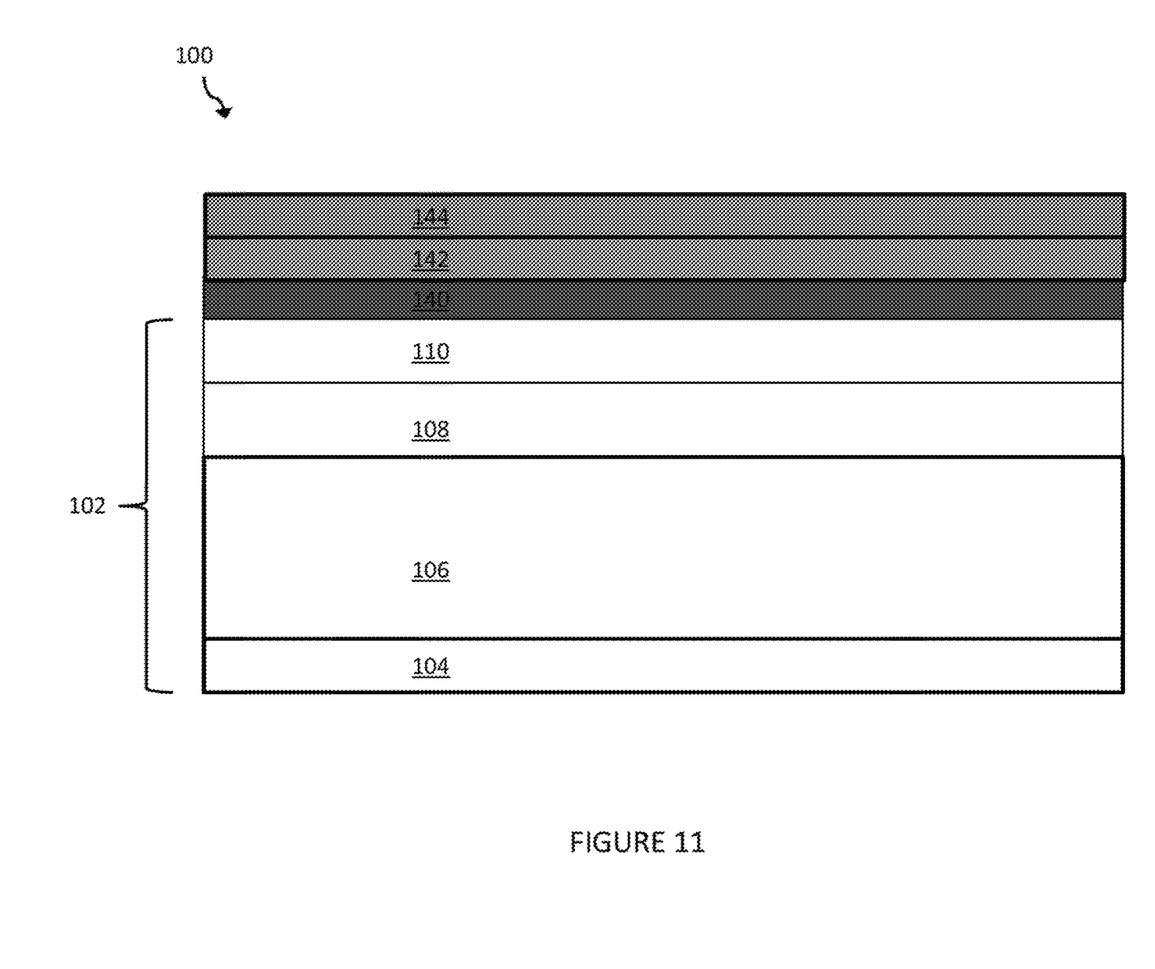
FIGS. 11-13 illustrate select method steps of forming the normally-off compound semiconductor transistor of FIG. 3, according to another embodiment.
Figure 12:
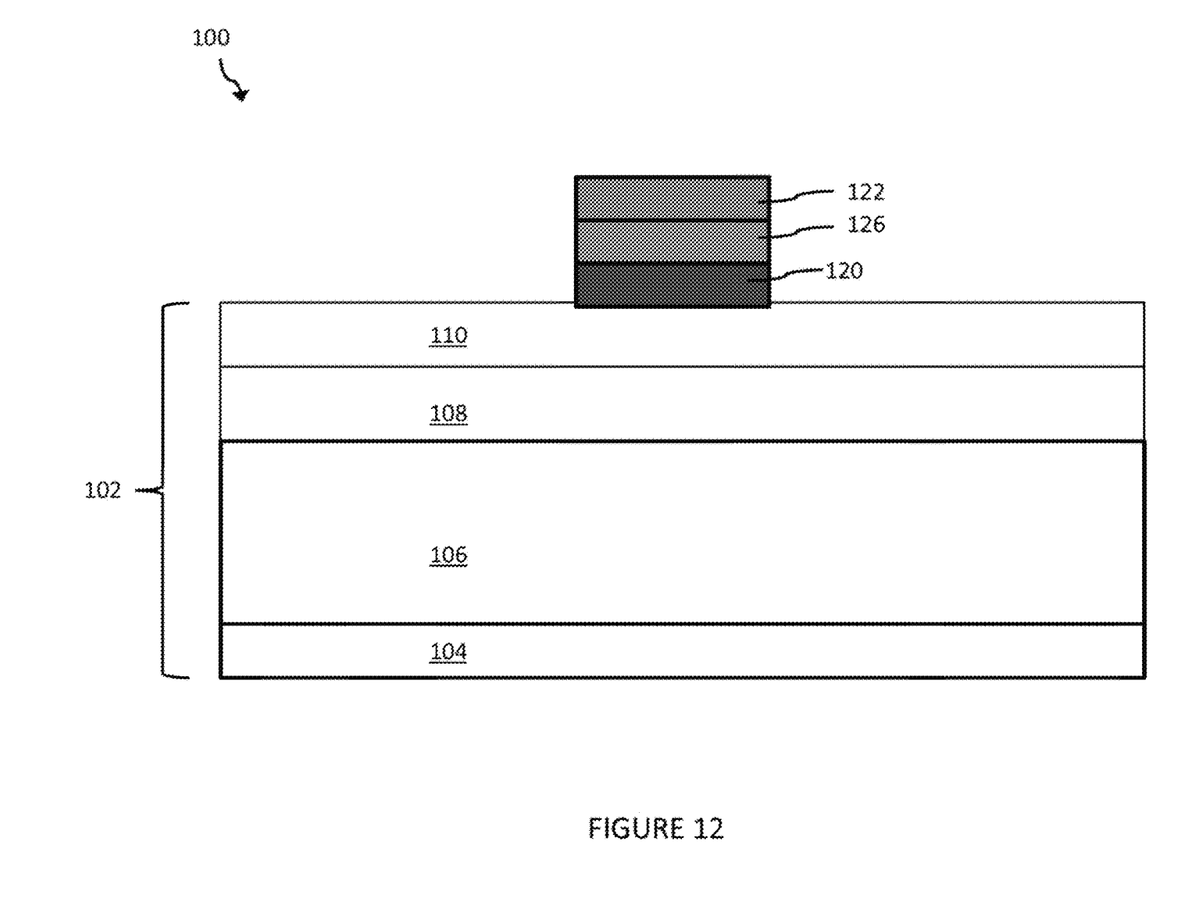
Figure 13:
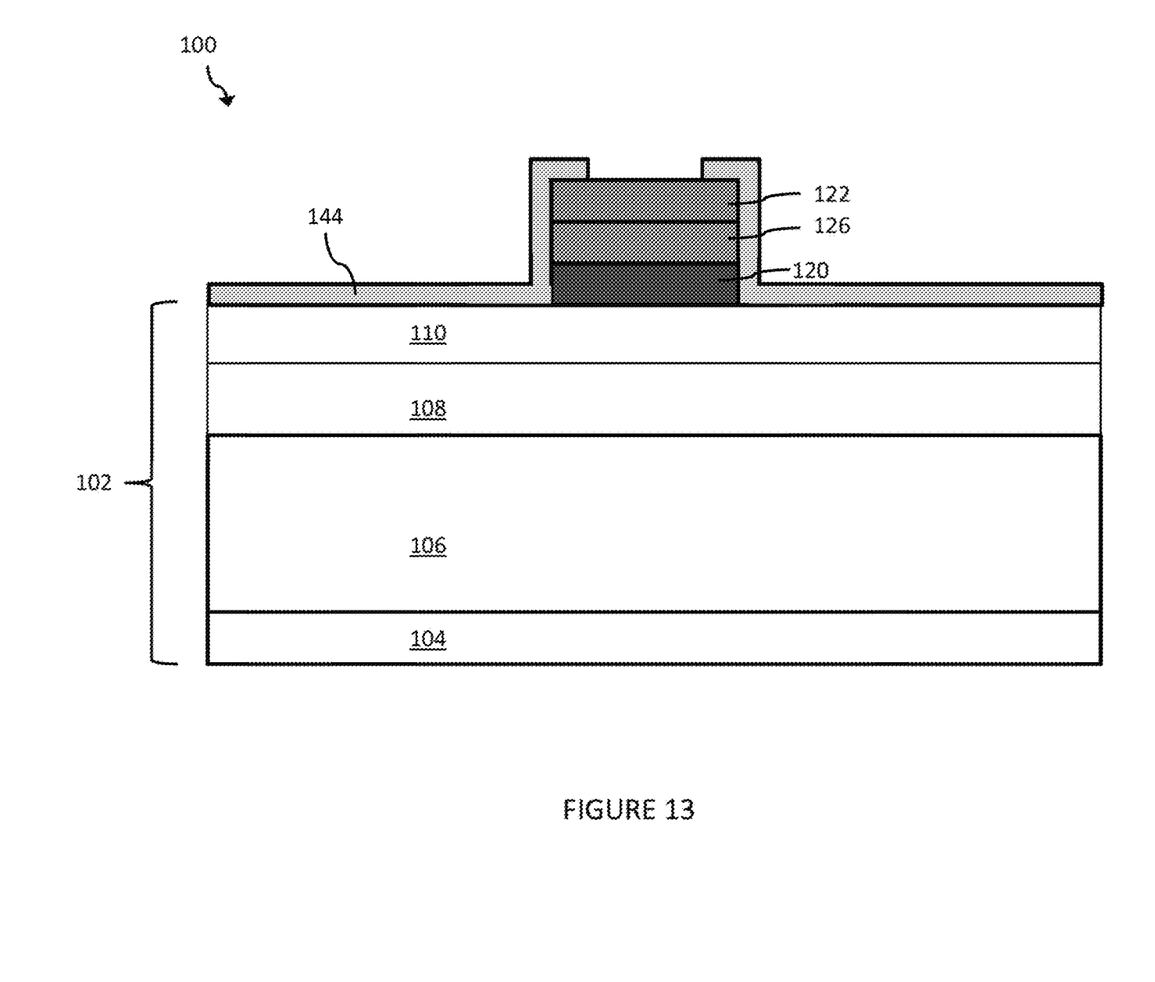

Referring to FIGS. 11-13, a method of forming the semiconductor device 100 is depicted, according to another embodiment. In this embodiment, the order of forming the passivation layer 144 and the gate electrode 122 is reversed. Whereas FIGS. 7-8 depict a process in which the passivation layer 144 is formed before the gate electrode 122 is formed, FIGS. 7-8 depict a process whereby the passivation layer 144 is formed on the heterostructure body 102 after the gate electrode 122 is formed.

Referring to FIG. 11, a heterostructure body 102 is provided. The heterostructure body 102 may be formed according to the same process steps as described with reference to FIGS. 6-7. Subsequently, a first conductive layer 146 is formed on the second semiconductor nitride layer 142, e.g., by a deposition technique.

Referring to FIG. 12, portions of the first doped semiconductor nitride layer 140, the second semiconductor nitride layer 142 and the first conductive layer 146 are removed. This may be done by an etching technique, for example. As a result, the doped semiconductor region 120, the interlayer 126 and the gate electrode 122 are provided.

Referring to FIG. 13, the passivation layer 144 is formed along the exposed portions of the heterostructure body 102, the doped semiconductor region 120, the interlayer 126 and the gate electrode 122. The passivation layer 144 may be formed by a deposition technique, for example. After the passivation layer 144 is formed, a portion of the passivation layer 144 that is disposed on the gate electrode 122 is removed, e.g., by an etching technique. As a result, a portion the gate electrode 122 is electrically accessible to an external interconnect metal.

In the figures provided herein, doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a heterostructure body with a buffer region, and a barrier region disposed on the buffer region and having a different band gap than the buffer region such that a two-dimensional charge carrier gas channel arises near an interface between the buffer region and the barrier region;
a gate structure on the heterostructure body for controlling the two-dimensional charge carrier gas channel, the gate structure comprising a doped semiconductor region disposed on the heterostructure body, an interlayer disposed on the doped semiconductor region, and a gate electrode disposed on the interlayer,
wherein a doping concentration of the doped semiconductor region is such that a portion of the two-dimensional charge carrier gas channel adjacent the gate structure is non-conductive at zero gate bias, and
wherein a thickness value of the interlayer is chosen such that
an equilibrium is reached between a total amount of holes injected from the gate electrode and present in the interlayer and a total electron-hole pair recombination effects.

2. The semiconductor device of claim 1, wherein the thickness value of the interlayer is within a region in which there is a favorable tradeoff between a static threshold voltage and a dynamic threshold voltage shift of the semiconductor device.

3. The semiconductor device of claim 2, wherein the thickness value of the interlayer is at a value at which the dynamic threshold voltage shift is minimized.

4. The semiconductor device of claim 1, wherein the buffer region comprises n-type GaN, wherein the doped semiconductor region comprises p-type GaN, and wherein the interlayer is formed from at least one of: InGaN, AlGaN, GaN, and a dielectric insulator.

* * * * *